United States Patent
Byeon et al.

(10) Patent No.: US 7,417,909 B2
(45) Date of Patent: Aug. 26, 2008

(54) SEMICONDUCTOR MEMORY DEVICE EMPLOYING CLAMP FOR PREVENTING LATCH UP

(75) Inventors: Sang-Jin Byeon, Ichon-shi (KR); Kang-Seol Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 567 days.

(21) Appl. No.: 11/019,570

(22) Filed: Dec. 23, 2004

(65) Prior Publication Data

US 2005/0237833 A1   Oct. 27, 2005

(30) Foreign Application Priority Data

Apr. 27, 2004   (KR) .................... 10-2004-0029265

(51) Int. Cl.
  *G11C 7/00* (2006.01)
(52) U.S. Cl. .................................. 365/203; 365/189.09
(58) Field of Classification Search ................. 365/203, 365/189.09, 210.12
See application file for complete search history.

(56) References Cited

U.S. PATENT DOCUMENTS

| | | | |
|---|---|---|---|
| 4,918,663 A | | 4/1990 | Remington et al. |
| 5,140,191 A | * | 8/1992 | Nogle et al. .................. 326/87 |
| 5,155,392 A | * | 10/1992 | Nogle .......................... 326/84 |
| 5,574,687 A | | 11/1996 | Nakase |
| 5,646,900 A | * | 7/1997 | Tsukude et al. ............. 365/205 |
| RE36,932 E | | 10/2000 | Furutani |
| 6,141,259 A | * | 10/2000 | Scott et al. ............. 365/189.06 |
| 6,377,508 B1 | | 4/2002 | Tomishima et al. |
| 6,462,584 B1 | | 10/2002 | Proebsting |

* cited by examiner

*Primary Examiner*—Thong Q Le
(74) *Attorney, Agent, or Firm*—Lowe Hauptman Ham & Berner LLP

(57) ABSTRACT

A semiconductor memory device employs a clamp for preventing latch up. For the purpose, the semiconductor memory device includes a precharging/equalizing unit for precharging and equalizing a pair of bit lines, and a control signal generating unit for producing a control signal which controls enable and disable of the precharging/equalizing unit, wherein the control signal generating unit includes a clamping unit to clamp its source voltage to a voltage level lower than that of its bulk bias.

19 Claims, 14 Drawing Sheets $V_{gate} > V_{th}$ $V_{emitter} = V_{base} = V_{collector} = 0V$ Vemitter = Vdd, Vbase = Vpp, Vcollector = Vbb Vemitter = Vdd, Vbase = Vpp↓, Vcollector = Vbb↑

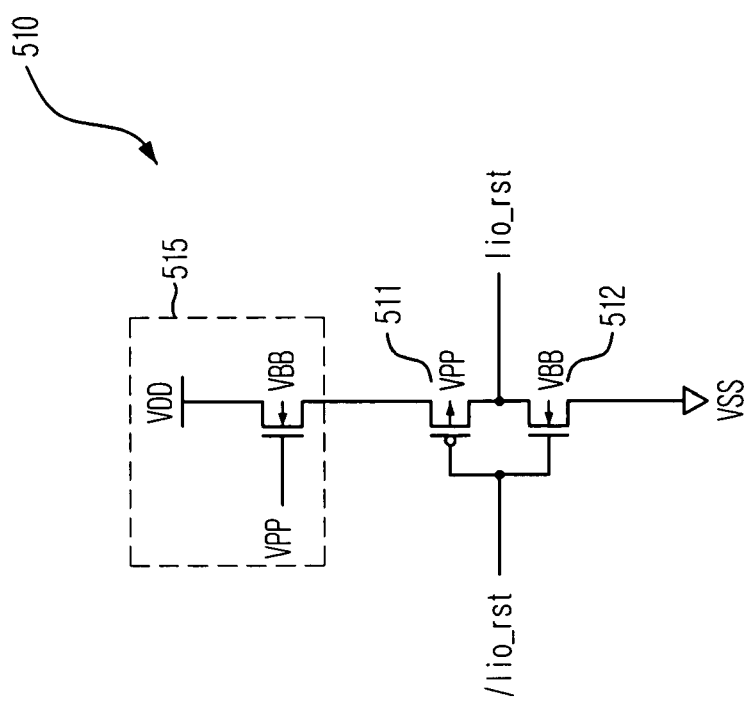
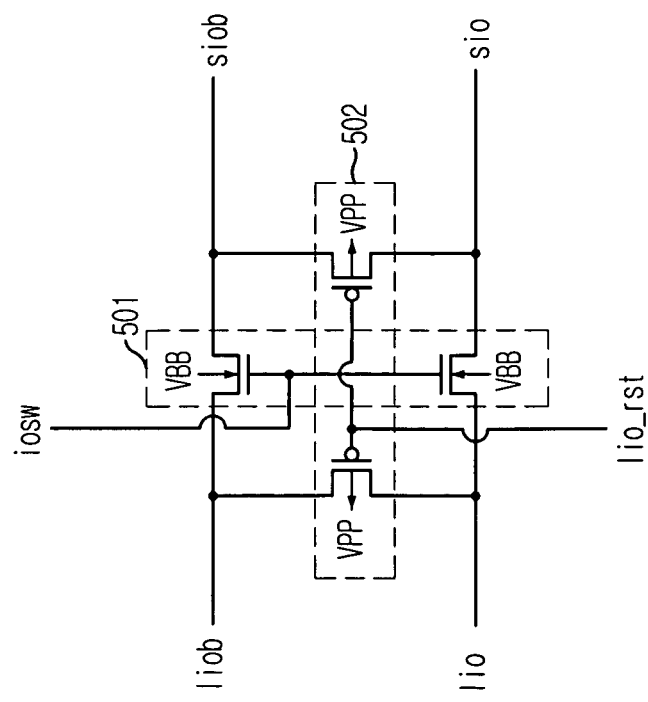
FIG. 10A

SEMICONDUCTOR MEMORY DEVICE EMPLOYING CLAMP FOR PREVENTING LATCH UP

FIELD OF THE INVENTION

The present invention relates to a semiconductor memory device; particularly to a circuit capable of preventing latch up with a clamp at a data line reset transistor which is used to precharge a data line and a bit line equalization transistor which is used to precharge a bit line in a dynamic random access memory (DRAM), and reducing power consumption.

BACKGROUND OF THE INVENTION

In general, since a CMOS inverter has a structure in which an NMOS transistor and a PMOS transistor are neighboring to each other, there occurs a latch up problem. The latch up increases power consumption of an entire chip in geometrical progression, resulting in inducing malfunction and destruction of the chip.

Hereinafter, with reference to a diagram of a general CMOS inverter, there will be explained a latch up phenomenon occurring in a CMOS region.

Referring to FIG. 1, there is shown a cross-sectional view of an NMOS and a PMOS transistor constructing a CMOS inverter.

The CMOS inverter is made with a P type substrate 101. An N-well 102 is formed on the P type substrate 101 and, in order to make the PMOS transistor within the N-well 102, there are formed p+ impurity diffusion regions 103a and 103b, which are a source and a drain of the PMOS transistor. In order to pick up the N-well 102, there is formed an n+ impurity diffusion region 104. Furthermore, a P-well 105 is constructed on an N type substrate and, in order to make the NMOS transistor within the P-well 105, there are formed n+ impurity diffusion regions 106a and 106b. To pick up the P-well 105, there is made a p+ impurity diffusion region 107. In this structure, the CMOS inverter contains a PNP type bipolar junction transistor 108 in the PMOS area and an NPN type bipolar junction transistor 109 in the NMOS area as two undesired parasitic bipolar junction transistors when the chip operates.

Since there is generated a path of low resistance between Vdd and Vss as the two parasitic bipolar junction transistors 108 and 109 interact, excess current flows from Vdd to Vss and, as a result, there occurs the latch up phenomenon which induces the destruction and malfunction of a device.

FIGS. 2A and 2B provide energy band diagrams of an NMOS transistor.

As shown in FIG. 2A, if a voltage is not provided to a gate electrode, since a structure of source-channel-drain about beneath an insulating layer of a gate is an N-P-N junction structure, the channel region at a center acts as a barrier to block electron flow between the source and the drain. However, as described in FIG. 2B, if a positive voltage is sufficiently supplied to the gate electrode, since a gate voltage becomes higher than a threshold voltage Vth and, thus, an energy band of the channel region moves to a lower level by a junction field effect, a barrier of the channel region lowers enough and, as a result, electrons can flow between the source and the drain. That is, if the source-channel-drain has an N-N-N structure, the channel type is changed from P to N or from N to P and this kind of phenomenon is called by carrier inversion. As can be seen above, in a MOS field effect transistor (MOSFET), the channel between the source and the drain can be turned on or off by adjusting the gate voltage.

A bipolar junction transistor also operates like the MOSFET described above.

FIGS. 3A to 3C describe energy band diagrams of a PNP type bipolar junction transistor.

FIG. 3A shows a condition that a voltage is not supplied to each node of an emitter, a base and a collector of the transistor. The base region at a center acts as a barrier to block electron flow between the emitter and the collector. If a forward voltage is provided to between the emitter and the base or between the collector and the base, since an energy level of the base rises and, thus, a PN diode is turn on, there occurs current flow in the bipolar junction transistor. As described in FIG. 3B, since a supply voltage Vdd is provided to the emitter electrode in a practical operation, when the base electrode is provided by a voltage Vpp which is boosted as much as a minimum threshold voltage Vth from the supply voltage Vdd in a semiconductor circuit and the collector electrode is supplied by a voltage Vbb which is reduced as much as the minimum threshold voltage Vth from a ground voltage Vss inside the semiconductor circuit, the energy band of the base region is further lowered and the PN diode is turned off, resulting in blocking the current flow. However, as shown in FIG. 3C, if the base voltage becomes lower than the boosted voltage Vpp, the PN diode is turned on and, thus, there occurs the current flow from the emitter to the base.

In case of the CMOS inverter in FIG. 1, since a base of the PNP type bipolar junction transistor 108 is connected to a collector of the NPN type bipolar junction transistor 109 and a base of the NPN type bipolar junction transistor 109 is attached to a collector of the PNP type bipolar junction transistor, both of the PNP type and the NPN type bipolar junction transistors 108 and 109 are turned on by their interaction and, thus, there occurs the current flow from the supply voltage node Vdd, i.e., the source of the PMOS transistor, to the ground voltage node Vss, i.e., the source of the NMOS transistor.

Meanwhile, since the afore-mentioned latch up can occur within a DRAM device, it can be figured out in detail hereinafter.

FIG. 4 represents a block diagram of a core area in a DRAM device. As described in the drawing, the core area includes dynamic type memory cells 111, each cell consisting of one transistor and one capacitor, a pair of bit lines BL and /BL for reading and writing data of the cells 111, a precharging unit 112 for precharging the bit line pair, a sense amplifier 113, connected to the bit line pair, for amplifying electric potential difference of the bit line pair, and a sense amplifier driver 114 for providing driving signals RTO and SB to the sense amplifier 113. An equalization signal BLEQ is coupled to the bit line precharging unit 112 and an equalizer in the sense amplifier driver 114.

FIG. 5 illustrates a CMOS inverter for producing a conventional equalization signal bleq and FIG. 6 shows a circuit for precharging and equalizing a conventional data line lio or gio.

As shown in FIG. 5, in the CMOS inverter for generating the conventional equalization signal bleq, a PMOS transistor 121 uses a supply voltage VDD as its source voltage and a boosted voltage VPP as its bulk bias. On the other hand, an NMOS transistor 122 uses a ground voltage VSS as its source voltage and a reduced voltage VBB as its bulk bias. In case the boosted voltage VPP and the reduced voltage VBB are unstable, since a parasitic PNP type bipolar junction transistor of the PMOS transistor 121 and a parasitic NPN type bipolar junction transistor of the NMOS transistor 122 are in gear and interact, excess current flows from VDD to VSS and, as a result, there occurs the latch up phenomenon inducing the destruction and malfunction of the device.

In the circuit for precharging and equalizing the conventional data line lio or gio described in FIG. 6, a core voltage VCORE that is lower than the supply voltage VDD used in peripheral circuits of a semiconductor memory device is used as a source voltage of PMOS transistors 123, 125, 127 and 128. The core voltage VCORE is derived from the supply voltage VDD.

An operational principle of a data line precharging/equalizing circuit is as follows. If a data line driving unit 131 is coupled with an input signal in of a high level and an inverted input signal inb of a low level, the data line lio and the inverted data line liob are driven to the ground voltage level VSS and the core voltage level VCORE, respectively. On the other hand, if the data line driving unit 131 is provided with the input signal in of a low level and the inverted input signal inb of a high level, the data line lio and the inverted data line liob are driven to the core voltage level VCORE and the ground voltage level VSS, respectively.

When precharging and equalizing the data line pair lio and liob, the data line driving unit 131 does not perform the driving operation in response to the input signals in and inb of a low level coupled thereto, which make the transistors 123 to 126 of the data line driving unit 131 turned off. After then, a precharging/equalizing unit 132 is activated in response to a data line equalizing control signal lio_eq having a low level. The data line pair lio and liob are precharged with the core voltage VCORE by the operation of the PMOS transistors 127 and 128 of the precharging/equalizing unit 132 and they are equalized to an identical level by the operation of a PMOS transistor 129.

Namely, if the equalizing control signal lio_eq having a low level is inputted, the data line precharging transistors 127 and 128 are turned on to precharge the data line pair with the core voltage VCORE and the equalizing transistor 129 is turned on to equalize the data line pair lio and liob (or gio and giob) to the identical level.

The principle in which the latch up occurs in the data line equalizing circuit of FIG. 6 is identical to that of the CMOS inverter of FIG. 5 and, thus, the repeated explanation will be omitted. Regions in which the latch up occurs are as follows. Firstly, the latch up occurs at the PMOS transistor 123 and the NMOS transistor 124 for precharging the inverted data line liob (or giob) of the data line driving unit 131. Secondly, the latch up occurs at the PMOS transistor 125 and the NMOS transistor 126 for precharging the data line lio (or gio) of the data line driving unit 131. Lastly, the latch up occurs since a closed loop is made by the PMOS transistor 127 in the data line precharging/equalizing unit 132 and the NMOS transistor 124 for precharging the inverted data line liob (or giob). Likewise, the latch up occurs since a closed loop is made between the PMOS transistor 128 in the data line precharging/equalizing unit 132 and the NMOS transistor 126 for precharging the data line lio (or gio) in the data line driving unit 131.

As shown in FIGS. 5 and 6, in the structure of just using the supply voltage VDD and the core voltage VCORE, when the boosted voltage VPP and the reduced voltage VBB are unstable, wherein the boosted voltage VPP is obtained by boosting the supply voltage VDD used as the bulk bias of the PMOS transistor and the NMOS transistor as much as the minimum threshold voltage Vth and the reduced voltage VBB is made by reducing the ground voltage VSS as much as the minimum threshold voltage Vth, the latch up phenomenon inducing the destruction and malfunction of the device occurs by excess current flowing from the supply voltage VDD and the core voltage VCORE to the ground voltage VSS, wherein the excess current is induced by the interaction of the PNP type bipolar junction transistor in the PMOS transistor region and the NPN type bipolar junction transistor in the NMOS transistor region.

Among the conventional technology of preventing the latch up, there is a method of reducing a gain of the parasitic bipolar junction transistor. This method decreases the current gain of the parasitic bipolar junction transistor by dropping a bias voltage between the base and the emitter through reducing parasitic resistance. As methods for reducing the parasitic resistance, there are a method of reducing substrate resistance by using an epitaxial layer and that of reducing well resistance by using a retrograde well or increasing well doping. As another method, there is a method of forming pick-up to have a sufficient distance when performing layout. However, these methods are not effective since an area increases and they are not applicable since it is required to change parameters of manufacturing and a device.

SUMMARY OF THE INVENTION

It is, therefore, a primary object of the present invention to provide a semiconductor memory device employing a clamp for preventing the latch up.

In accordance with one embodiment of the present invention, there is provided a semiconductor memory device comprising a precharging/equalizing unit for precharging and equalizing a pair of bit lines, and a control signal generating unit for producing a control signal which controls enable and disable of the precharging/equalizing unit, wherein the control signal generating unit includes a clamping unit to clamp its source voltage to a voltage level lower than that of its bulk bias.

In accordance with another embodiment of the present invention, there is provided a semiconductor memory device comprising a sense amplifier, connected to a pair of bit lines, for amplifying electric potential difference of the bit line pair, a precharging/equalizing unit for precharging and equalizing a driving voltage line of the sense amplifier, and a control signal generating unit which produces a control signal to control enable and disable of the precharging/equalizing unit, wherein the control signal generating unit includes a clamping unit to clamp its source voltage to a voltage level lower than that of its bulk bias.

In accordance with still another embodiment of the present invention, there is provided a semiconductor memory device comprising a pair of data lines, a precharging unit for precharging the data line pair, an equalizing unit for equalizing the data line pair, a first clamping unit for clamping a source voltage of the precharging unit to a voltage level lower than that of a bulk bias of the precharging unit, and a second clamping unit for clamping a source voltage of the equalizing unit to a voltage level lower than that of a bulk bias of the equalizing unit.

In accordance with further still another embodiment of the present invention, there is provided a semiconductor memory device comprising a pair of local data input/output (I/O) lines and a pair of segment data input/output (I/O) lines, an isolation switching unit for controlling transmission between the segment data I/O line pair and the local data I/O line pair, an equalizing unit for equalizing the segment data I/O line pair and the local data I/O line pair, and a control signal generating unit for producing a control signal used to control enable and disable of the equalizing unit, wherein the control signal generating unit includes a clamping unit to clamp its source voltage to a voltage level lower than that of its bulk bias.

BRIEF DESCRIPTION OF THE DRAWINGS

The above and other objects and features of the present invention will become apparent from the following description of preferred embodiments given in conjunction with the accompanying drawings, in which:

FIGS. 10A and 10B represent circuit diagrams of a semiconductor memory device in accordance with a fourth embodiment of the present invention.

DETAILED DESCRIPTION OF THE PREFERRED EMBODIMENTS

Hereinafter, with reference to the drawings, some of the preferred embodiments of the present invention will be explained in detail.

Figure 1:
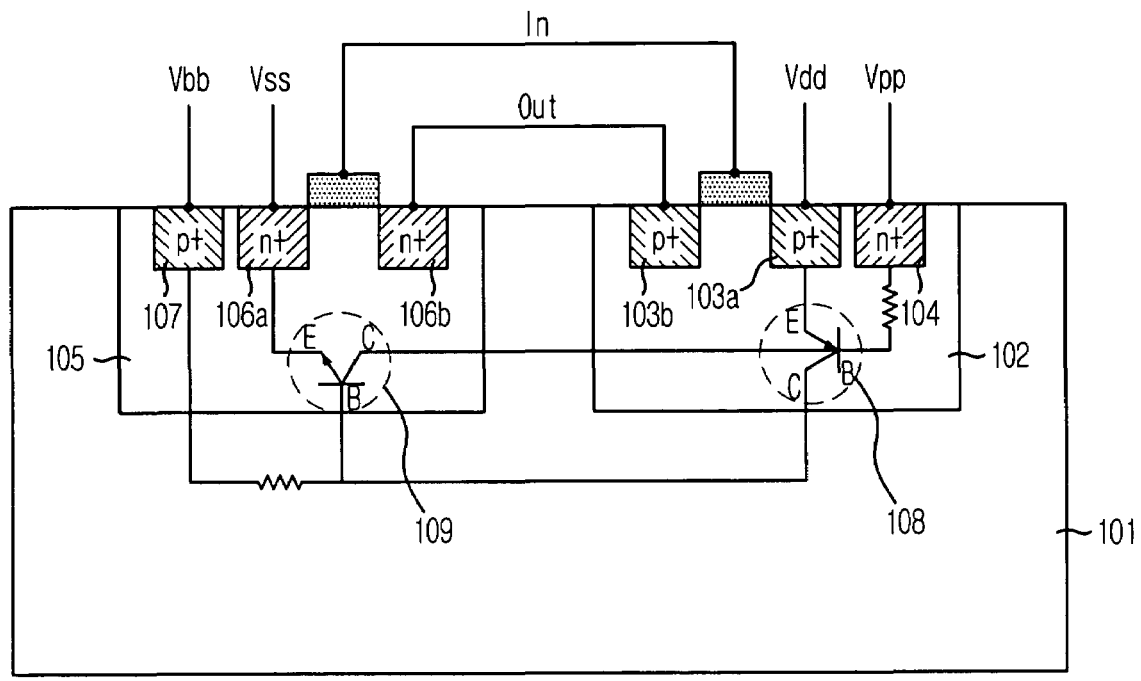
FIG. 1 shows a cross-sectional view of a MOS transistor and a bipolar junction transistor in a CMOS transistor.
Figure 2A:
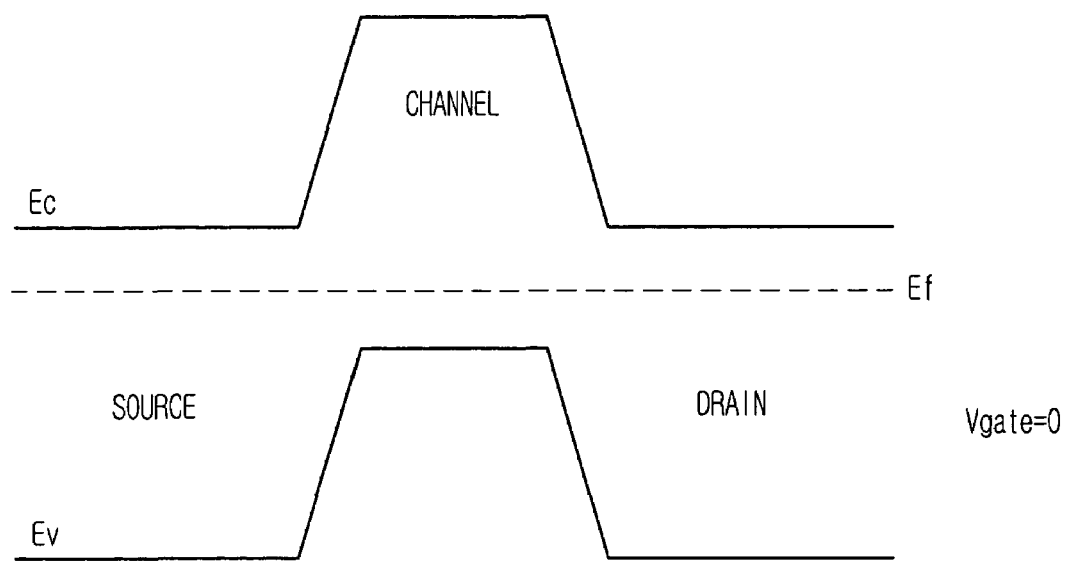
FIGS. 2A and 2B provide energy band diagrams of an NMOS transistor.
Figure 2B:
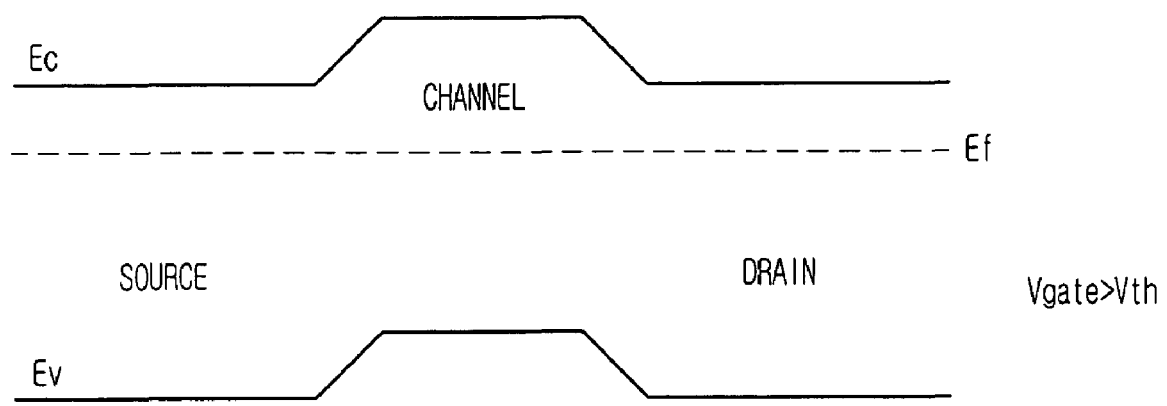
Figure 3A:
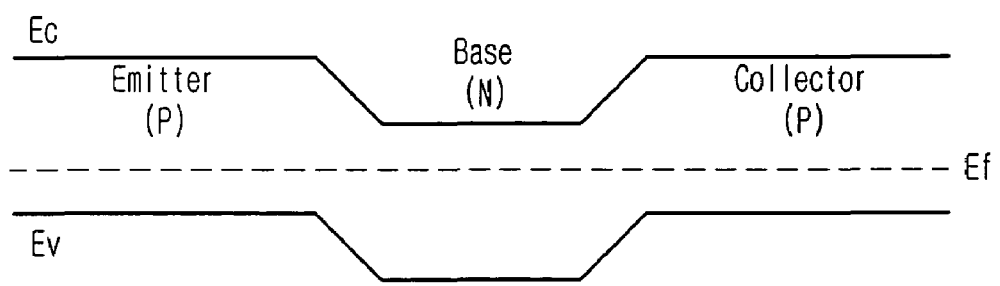
FIGS. 3A to 3C describe energy band diagrams of a PNP type bipolar junction transistor.
Figure 3B:
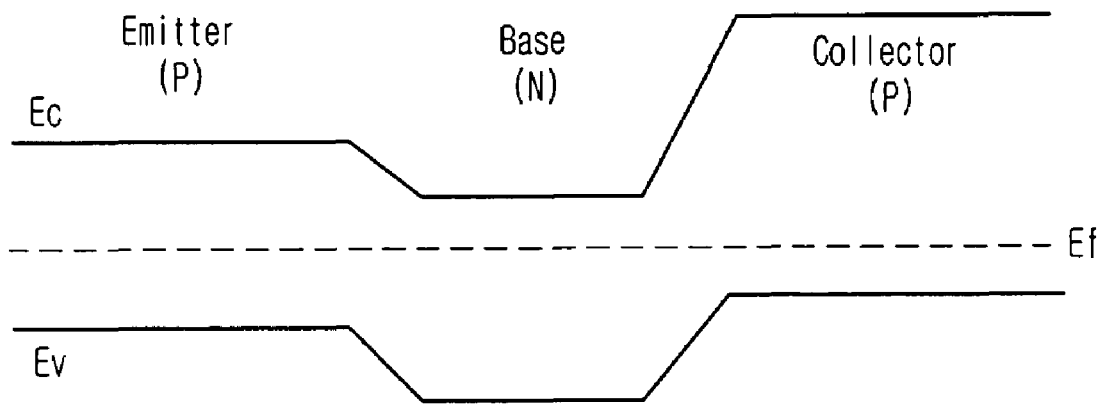
Figure 3C:
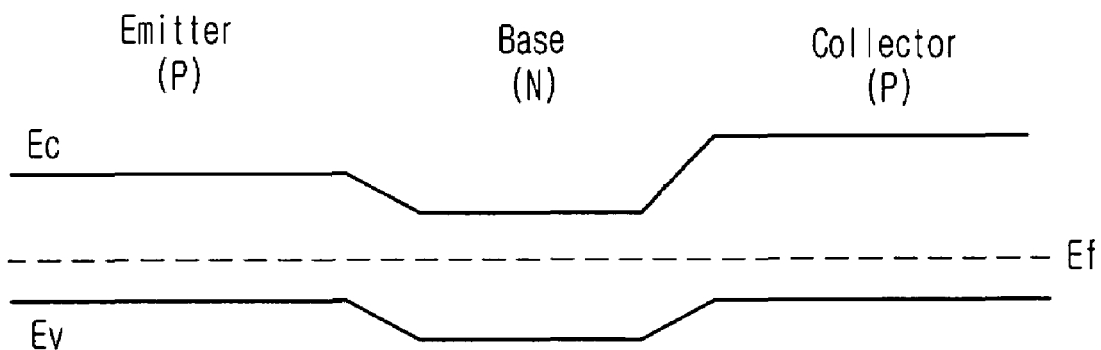
Figure 4:
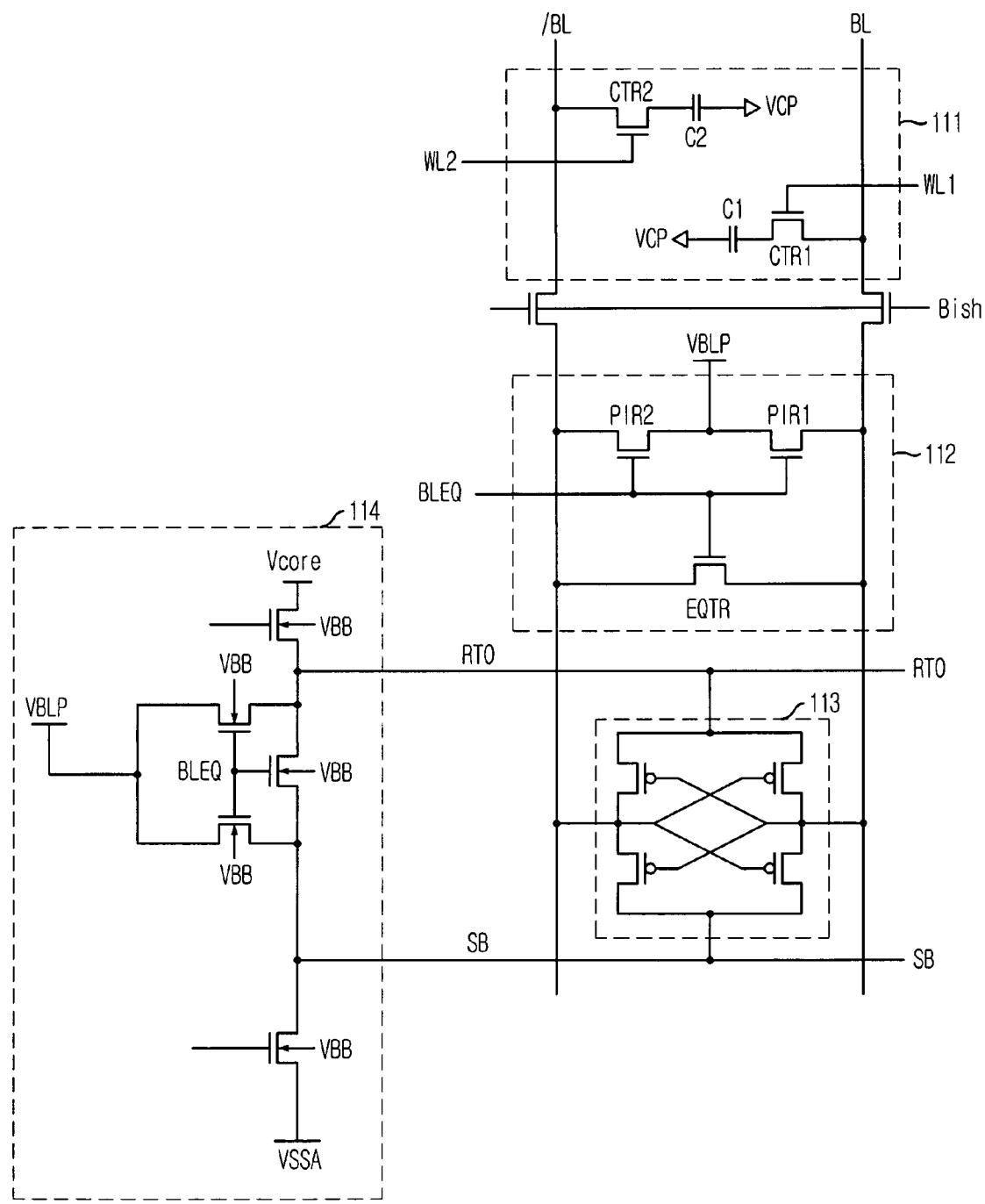
FIG. 4 represents a block diagram of a core area in a DRAM device.
Figure 5:
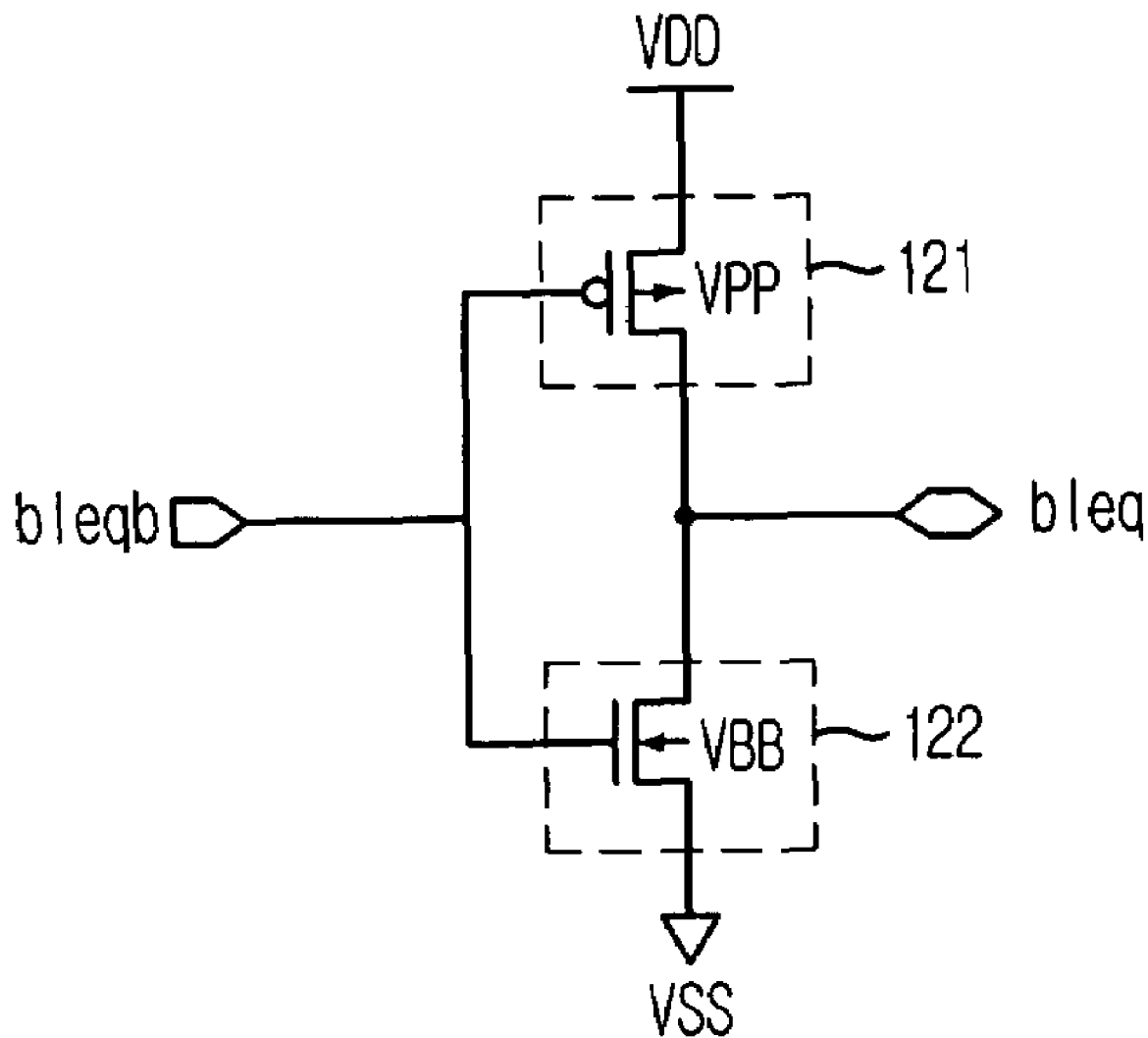
FIG. 5 illustrates a circuit diagram of a CMOS inverter for producing a conventional equalization signal.
Figure 6:
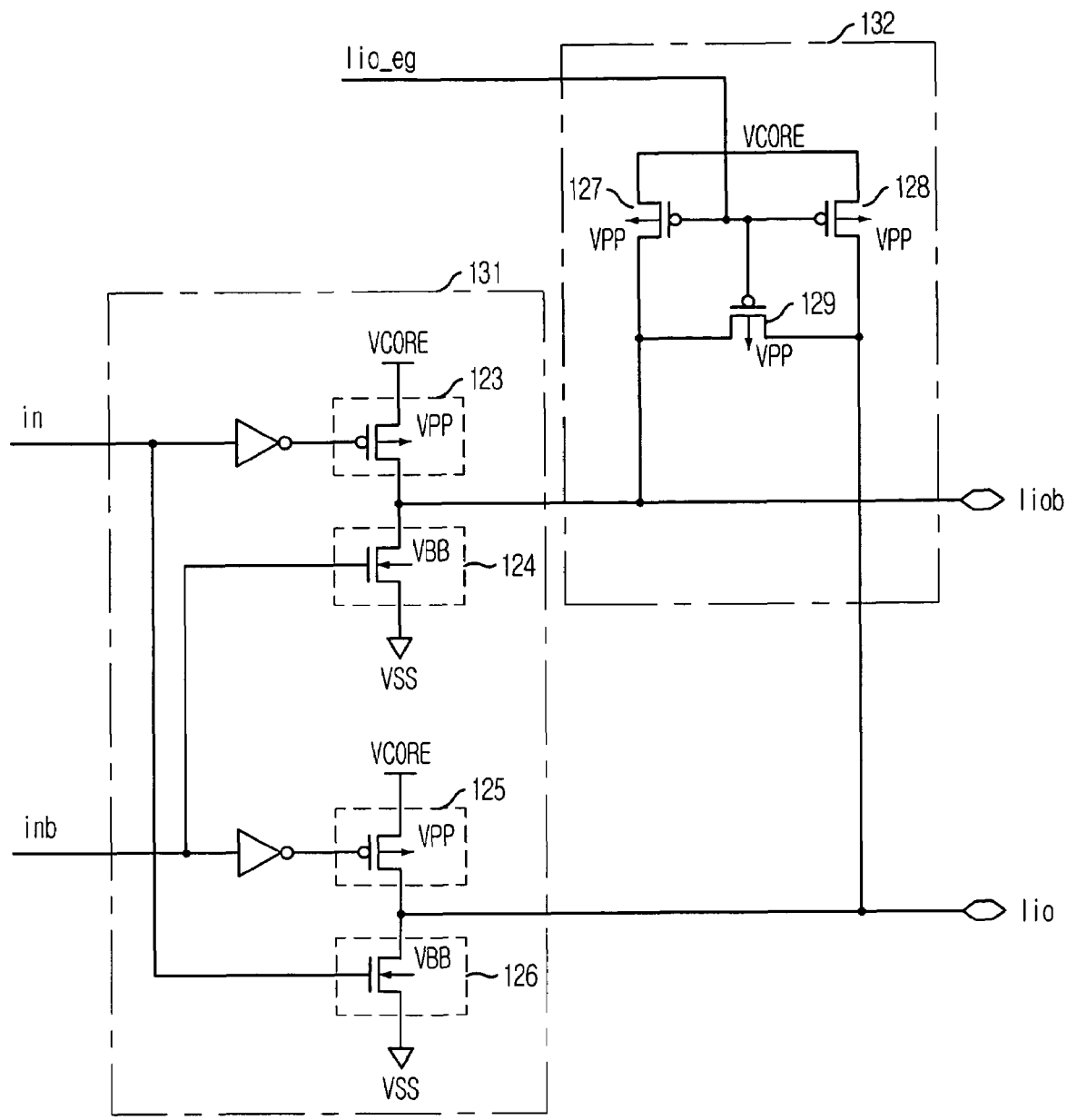
FIG. 6 shows a circuit diagram of a conventional data line precharging/equalizing circuit.
Figure 7A:
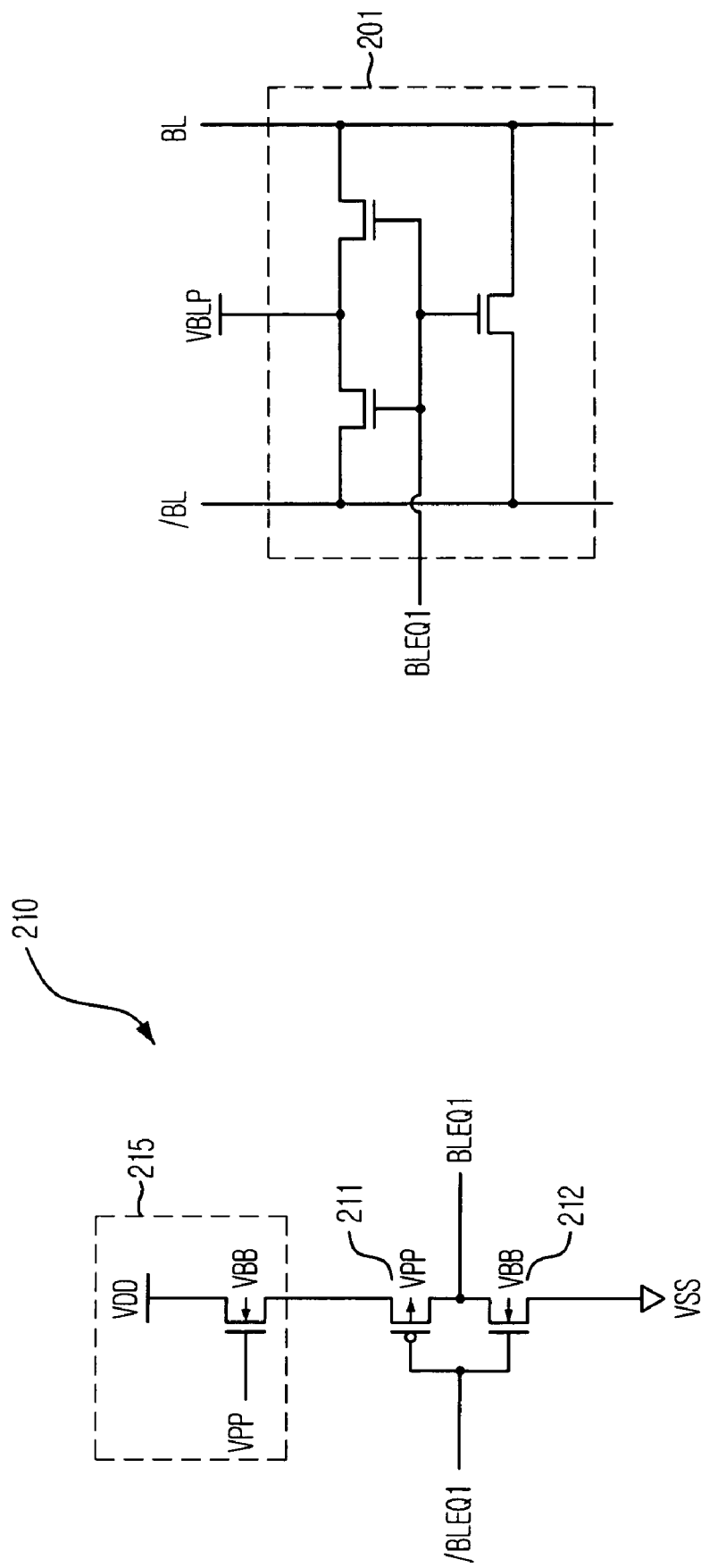
FIGS. 7A and 7B provide circuit diagrams of a semiconductor memory device in accordance with a first embodiment of the present invention.
Figure 7B:
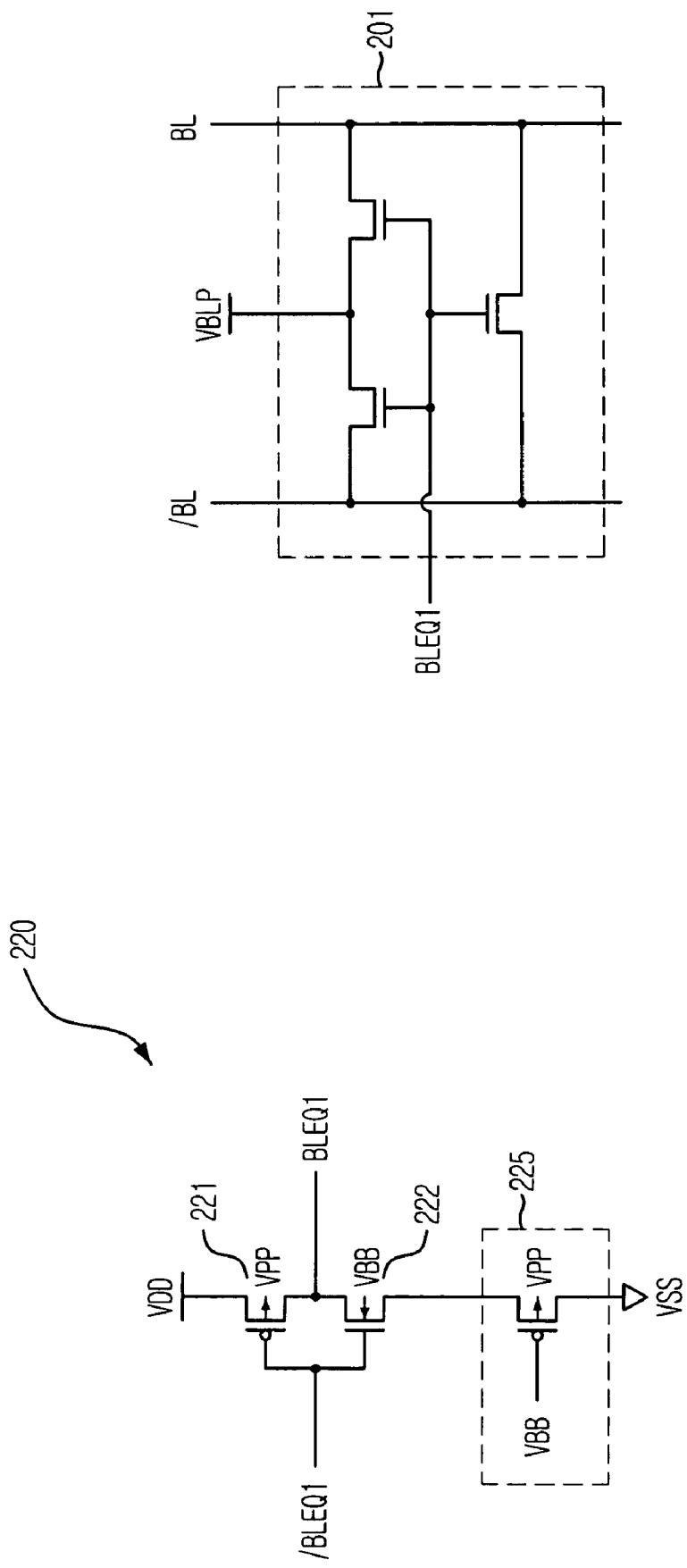

FIGS. 7A and 7B provide circuit diagrams of a bit line precharging/equalizing unit and a control signal generating unit for producing a control signal to the bit line precharging/equalizing unit in accordance with a first embodiment of the present invention.

Referring to FIGS. 7A and 7B, a pair of bit lines BL and /BL is connected to a bit line precharging/equalizing unit 201 for precharging the bit line pair BL and /BL and performing an equalizing operation to maintain voltages of the bit line pair BL and /BL in the same level, and an equalization signal BLEQ1 is used as a control signal for controlling enable or disable of the bit line precharging/equalizing unit 201. The equalization signal BLEQ1 is produced at a control signal generating unit 210 or 220 and provided to the precharging/equalizing unit 201. The control signal generating unit 210 (or 220) includes a clamping unit 215 (or 225) for clamping its source voltage to a lower level than a bulk bias of a MOS transistor.

Meanwhile, the bit line precharging/equalizing unit 201 operates if the equalization signal BLEQ1 of a high level is coupled thereto and, thus, three NMOS transistors in the precharging/equalizing unit 201 are turned on to thereby precharge and equalize the bit line pair BL and /BL with a VBLP level.

As shown in FIG. 7A, the control signal generating unit 210 includes an input node at which a gate of a PMOS transistor 211 is connected to that of an NMOS transistor 212 and an output node at which drains of the PMOS and the NMOS transistors 211 and 212 are attached to each other. The PMOS transistor 211 uses a boosted voltage VPP as a bulk bias and receives an output voltage of the clamping unit 215 as a source voltage. On the other hand, the NMOS transistor 212 uses a reduced voltage VBB as a bulk bias and receives a ground voltage Vss as a source voltage.

The clamping unit 215 is formed with an NMOS transistor which receives as its gate voltage the boosted voltage VPP which is used as the bulk bias of the PMOS transistor 211, has a drain provided with the supply voltage VDD, receives the reduced voltage VBB as a bulk bias, and generates an output voltage to its source.

Herein, if the supply voltage VDD passes through the clamping unit 215, the output voltage of (Vpp−Vth) is coupled to the source of the PMOS transistor 211, wherein the output voltage (Vpp−Vth) is obtained by subtracting a threshold voltage Vtn from the boosted voltage VPP.

If the input node of the control signal generating unit 210 is provided with an input signal of a low level, the control signal generating unit 210 outputs an output voltage of the clamping unit 215 which becomes an enable signal of the bit line precharging/equalizing unit 201 through its output node. On the other hand, if the input signal having a high level is provided thereto, the control signal generating unit 210 outputs the ground voltage VSS which becomes a disable signal of the bit line precharging/equalizing unit 201 through its output node. Then, the precharging/equalizing unit 201 operates according to a voltage level at the output node of the control signal generating unit 210.

Since the boosted voltage VPP is made by boosting the supply voltage VDD as much as the minimum threshold voltage Vth, even though changing the supply voltage VDD at the control signal generating unit 210 to the output voltage of the clamping unit 215, the output voltage (Vpp−Vth) has a voltage level which is almost similar to that of the supply voltage VDD.

Although the boosted voltage VPP has an unstable voltage level compared to the conventional case of using the supply voltage VDD, a voltage (Vpp−Vth) provided to the source of the PMOS transistor 211 in the control signal generating unit 210 is determined by the voltage level of the boosted voltage VPP.

Therefore, even if the boosted voltage VPP has an unstable voltage level which is dropped to a voltage level lower than that of the supply voltage VDD, since the voltage level passed through the clamping unit 215 becomes lower than the voltage level of the boosted voltage VPP, the parasitic PNP type bipolar junction transistor inside of the CMOS inverter consisting of the PMOS transistor 211 and the NMOS transistor 212 maintains the closed state and, thus, it becomes possible to preclude the latch up phenomenon from occurring.

The boosted voltage VPP is also used as the gate voltage of the clamping unit 215 and the bulk bias of the PMOS transistor 211. Accordingly, power consumption of the device can be reduced by using the boosted voltage VPP as the voltage coupled to the gate of the clamping unit 215.

Referring to FIG. 7B, the control signal generating unit 220 includes an input node at which a gate of a PMOS transistor 221 is connected to that of an NMOS transistor 222 and an output node at which drains of the PMOS and the NMOS transistors 221 and 222 are attached to each other. The PMOS transistor 221 uses the boosted voltage VPP as a bulk bias and receives the supply voltage VDD as a source voltage. On the other hand, the NMOS transistor 222 uses the reduced voltage VBB as a bulk bias and receives an output voltage of a clamping unit 225 as a source voltage.

The clamping unit 225 is formed with a PMOS transistor which receives as its gate voltage the reduced voltage VBB which is used as the bulk bias of the NMOS transistor 222, has a source provided with the ground voltage Vss, receives the boosted voltage VPP as a bulk bias, and generates the output voltage to its drain.

Herein, if the ground voltage VSS passes through the clamping unit 225, the output voltage of (VBB+Vtp) is coupled to the source of the NMOS transistor 222, wherein the output voltage (VBB+Vtp) is obtained by summing up a threshold voltage Vth and the reduced voltage VBB.

If the input node of the control signal generating unit 220 is coupled with an input signal of a high level, the control signal generating unit 220 outputs the output voltage of the clamping unit 225, which becomes the disable signal of the bit line precharging/equalizing unit 201 through its output node. On the other hand, if the input signal having a low level is provided thereto, the control signal generating unit 220 outputs the supply voltage VDD which becomes the enable signal of the bit line precharging/equalizing unit 201 through its output node. Then, the precharging/equalizing unit 201 operates according to a voltage level at the output node of the control signal generating unit 220.

Since the reduced voltage VBB is obtained by voltage-dropping the ground voltage VSS as much as the minimum threshold voltage Vth, even though changing the ground voltage VSS at the control signal generating unit 220 to the output voltage of the clamping unit 225, the output voltage (VBB+Vth) has a voltage level which is almost similar to that of the ground voltage Vss.

Although the reduced voltage VBB has an unstable voltage level compared to the conventional case of using the ground voltage VSS, the voltage (VBB+Vth) provided to the source of the NMOS transistor 222 in the control signal generating unit 220 is determined by the voltage level of the reduced voltage VBB.

Therefore, even if the reduced voltage VBB has an unstable voltage level which is boosted to a voltage level higher than that of the ground voltage VSS, since the voltage level passed through the clamping unit 225 becomes higher than the voltage level of the ground voltage VSS, the parasitic NPN type bipolar junction transistor inside of the CMOS inverter consisting of the PMOS transistor 221 and the NMOS transistor 222 maintains the closed state and, thus, it is possible to prevent the latch up phenomenon from occurring.

The reduced voltage VBB is also used as the gate voltage of the clamping unit 225 and the bulk bias of the NMOS transistor 222. Accordingly, power consumption of the device can be reduced by using the reduced voltage as the voltage coupled to the gate of the clamping unit 225.

Figure 8A:
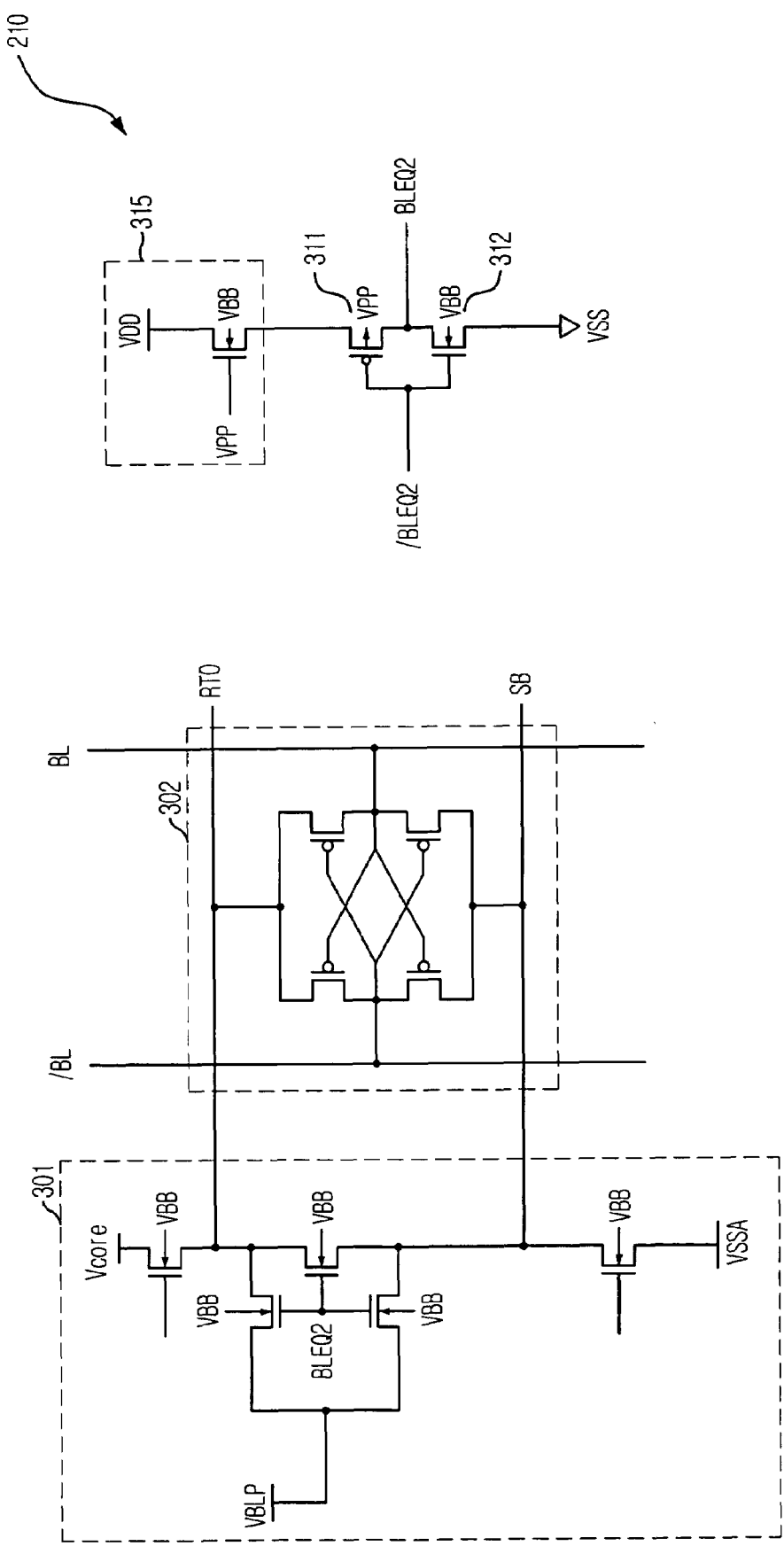
FIGS. 8A and 8B describe circuit diagrams of a semiconductor memory device in accordance with a second embodiment of the present invention.
Figure 8B:
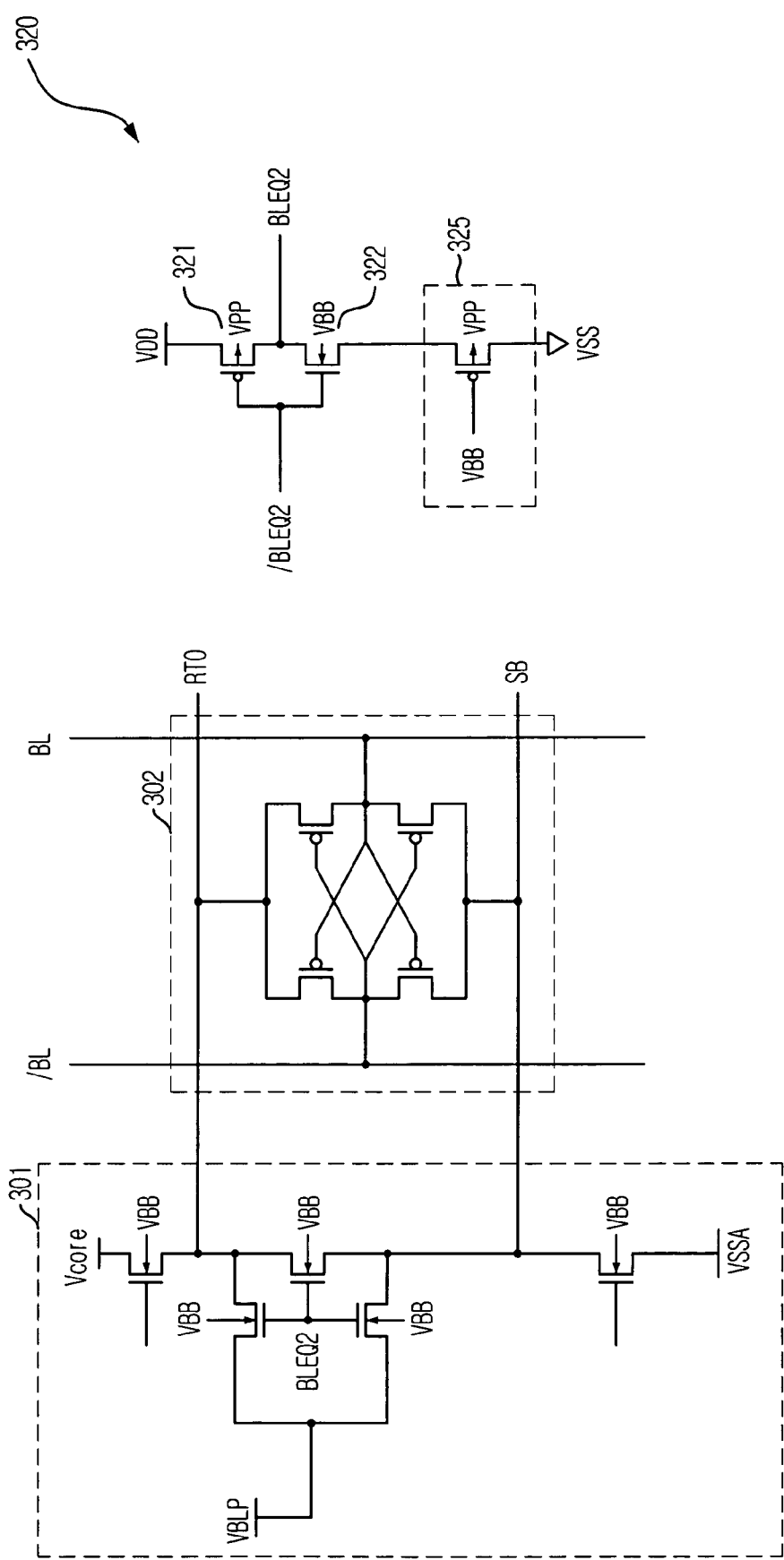

FIGS. 8A and 8B describe circuit diagrams of a sense amplifier, a precharging/equalizing unit for precharging and equalizing driving voltage lines of the sense amplifier and a control signal generating unit for producing a control signal provided to the precharging/equalizing unit in accordance with a second embodiment of the present invention.

Referring to FIGS. 8A and 8B, there are described a bit line sense amplifier 302, connected to a pair of bit lines BL and /BL, for amplifying electric potential difference of the bit line pair BL and /BL and a sense amplifier driver 301 which has a unit for precharging and equalizing driving voltage lines RTO and SB of the sense amplifier 302 and drives the driving voltage lines RTO and SB. An equalization signal BLEQ2 is used as a control signal for controlling enable or disable of the precharging/equalizing unit in the sense amplifier driver 301. The equalization signal BLEQ2 is produced at a control signal generating unit 310 or 320 and provided to the precharging/equalizing unit in the sense amplifier driver 301. The control signal generating unit 310 (or 320) contains a clamping unit 315 (or 325) for clamping its source voltage to a voltage level lower than a bulk bias of a MOS transistor.

Meanwhile, the basic construction of the control signal generating units 310 and 320 and the clamping units 315 and 325 are the same as those in FIGS. 7A and 7B and, thus, the repeated explanation will be omitted.

In the control signal generating unit 310 of FIG. 8A, if the supply voltage VDD passes through the clamping unit 315, the output voltage of (VPP−Vth) is coupled to the source of the PMOS transistor 315 in the control signal generating unit 310, wherein the output voltage (VPP−Vth) is obtained by subtracting a threshold voltage Vtn from the boosted voltage VPP.

If the input node of the control signal generating unit 310 is provided with an input signal of a low level, the control signal generating unit 310 precharges and equalizes the driving voltage lines RTO and SB of the sense amplifier 302 and outputs an output voltage of the clamping unit 315 which becomes an enable signal of the sense amplifier driver 301 for driving the driving voltage lines RTO and SB through its output node. On the other hand, if the input signal having a high level is provided thereto, the control signal generating unit 310 outputs the ground voltage VSS which becomes a disable signal of the sense amplifier driver 301 through its output node. Then, the precharging/equalizing unit operates according to a voltage level at the output node of the control signal generating unit 310.

In the meantime, in the control signal generating unit 320 of FIG. 8B, if the ground voltage VSS passes through the clamping unit 325, the output voltage of (VBB+Vtp) is coupled to the source of the NMOS transistor 322, wherein the output voltage (VBB+Vtp) is obtained by summing up a threshold voltage Vth and the reduced voltage VBB.

If the input node of the control signal generating unit 320 is provided with the input signal of a high level, the control signal generating unit 320 precharges and equalizes the driving voltage lines RTO and SB of the sense amplifier 302 and outputs an output voltage of the clamping unit 325 which becomes the disable signal of the sense amplifier driver 301 for driving the driving voltage lines RTO and SB through its output node. On the other hand, if the input signal having a low level is fed thereto, the control signal generating unit 320 outputs the supply voltage VDD which becomes the enable signal of the sense amplifier driver 301 through its output node. Then, the precharging/equalizing unit in the sense amplifier driver 301 operates according to a voltage level at the output node of the control signal generating unit 320.

As a result, it is possible to prevent the latch up phenomenon occurring between the PMOS transistor 311 and the NMOS transistor 312 of the control signal generating unit 310 in FIG. 8A and that occurring between the PMOS transistor 321 and the NMOS transistor 322 of the control signal generating unit 320 in FIG. 8B.

Figure 9A:
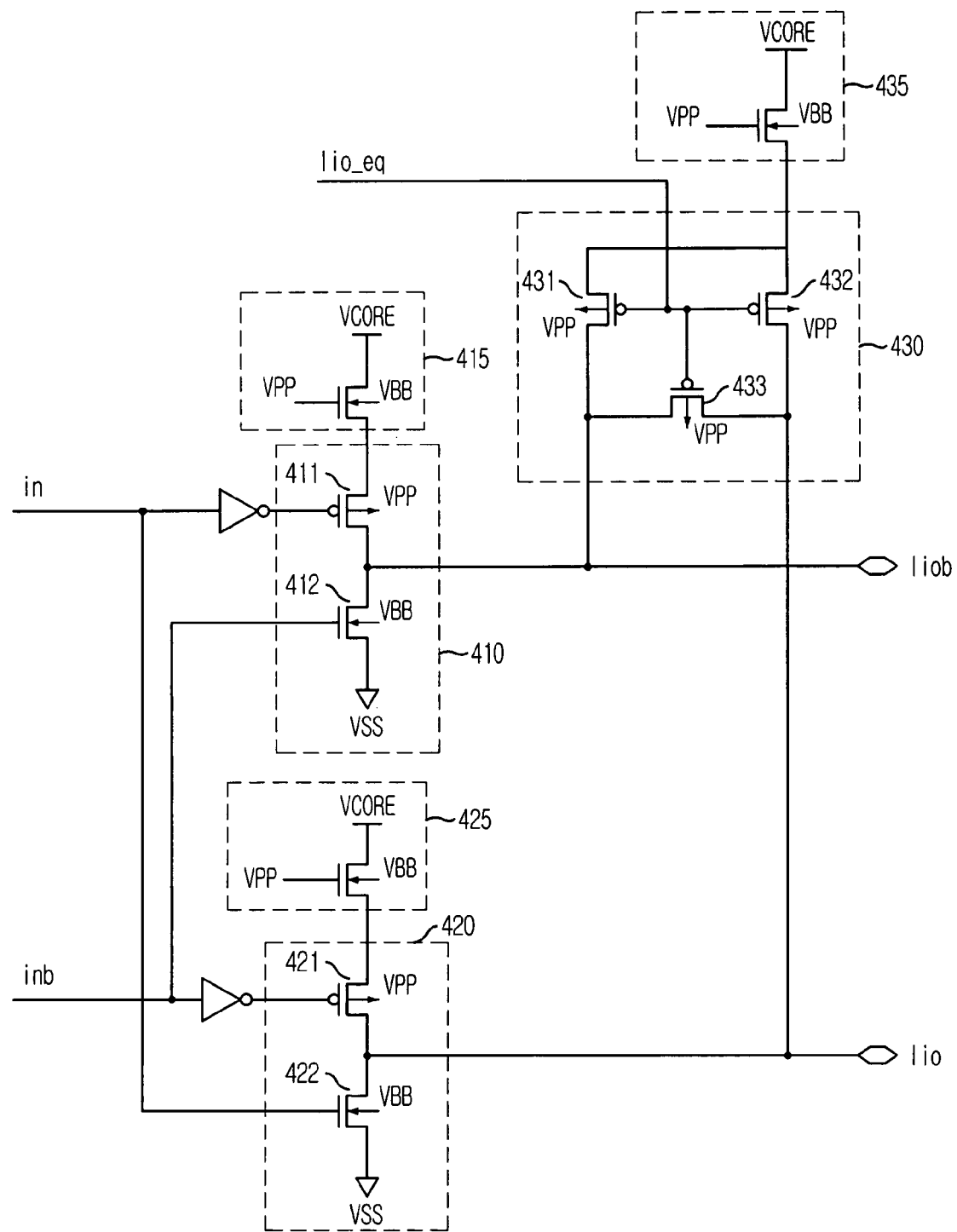
FIGS. 9A and 9B illustrate circuit diagrams of a semiconductor memory device in accordance with a third embodiment of the present invention.
Figure 9B:
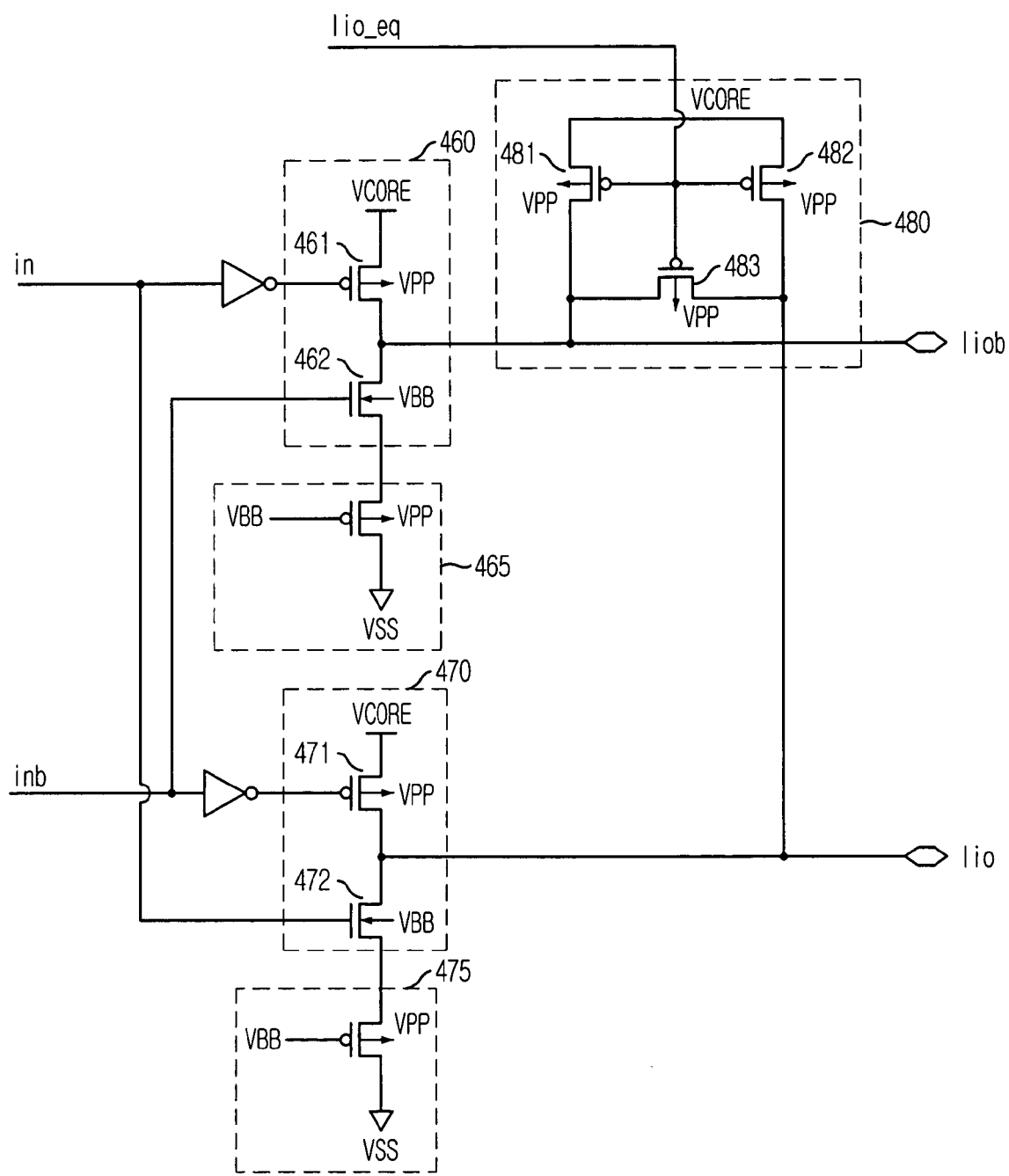

FIGS. 9A and 9B illustrate circuit diagrams of a driving unit for driving data lines and a precharging/equalizing unit for precharging and equalizing the data lines in accordance with a third embodiment of the present invention.

Referring to FIGS. 9A and 9B, there are shown data line driving units 410, 420, 460 and 470 for driving input signals in and inb to a pair of data lines lio and liob (or gio and giob), and data line precharging/equalizing units 430 and 480 for precharging and equalizing the data line pair lio and liob (or gio and giob). A control signal lio_eq is supplied to control enable or disable of the data line precharging/equalizing units 430 and 480.

In FIG. 9A, in order to prevent the latch up, the data line driving units 410 and 420 for driving the data line pair liob and lio employ the first clamping units 415 and 425 for clamping a core voltage VCORE, which is a source voltage of PMOS transistors 411 and 421, to a voltage level lower than a bulk bias of the PMOS transistors 411 and 421, and the data line precharging/equalizing unit 430 employs a second clamping unit 435 for clamping a core voltage VCORE, which is a common source voltage of PMOS transistors 431 and 432, to a voltage level lower than a bulk bias of the PMOS transistors 431 and 432.

Accordingly, in the data line driving unit 410 for driving the inverted data line liob (or giob) and the data line driving unit 420 for driving the data line lio (or gio), if the core voltage Vcore passes through the first clamping units 415 and 425, an output voltage of (VPP−Vth) is coupled to sources of the PMOS transistors 411 and 421, wherein the output voltage (VPP−Vth) is obtained by subtracting a threshold voltage Vtn from the boosted voltage Vpp.

Likewise, in the precharging/equalizing unit 430 for precharging and equalizing the data line pair, if the core voltage VCORE passes through the second clamping unit 435, an output voltage of (VPP−Vth) is coupled to sources of the PMOS transistors 431 and 432, wherein the output voltage (VPP−Vth) is obtained by subtracting a threshold voltage Vtn from the boosted voltage VPP.

If the data line driving units 410 and 420 are provided with the input signal in of a high level and the inverted input signal inb of a low level, the data line lio has a ground voltage level VSS and the inverted data line liob is driven to an output voltage level of the first clamping unit 415. On the other hand, if the input signal in of a low level and the inverted input signal inb of a high level are coupled, the data line lio is driven to an output voltage level of the first clamping unit 425 and the inverted data line liob is driven to the ground voltage level VSS.

When precharging and equalizing the data line pair, the input signals in and inb become a low level, so that all of the transistors 411, 412, 421 and 422 of the data line driving units 410 and 420 are turned off.

After then, the equalizing control signal lio_eq having a low level is coupled to enable the precharging/equalizing unit 430. Then, two data line precharging transistors 431 and 432 are turned on to precharge the data line pair lio and liob (or gio and giob) with an output voltage of the second clamping unit 435 instead of the core voltage VCORE and an equalizing transistor 433 is also turned on to equalize the data line pair lio and liob (or gio and giob) to have the same level.

In FIG. 9B, in order to prevent the latch up, the data line driving units 460 and 470 for driving the data line pair employ first clamping units 465 and 475 for clamping the ground voltage VSS, which is a source voltage of NMOS transistors 462 and 472, to a voltage level higher than a bulk bias of the NMOS transistors 462 and 472.

Accordingly, in the data line driving unit 460 for driving the inverted data line liob (or giob) and the data line driving unit 470 for driving the data line lio (or gio), if the ground voltage VSS passes through the first clamping units 465 and 475, an output voltage of (VBB+Vth) is supplied to sources of the NMOS transistors 462 and 472 in the data line driving units 460 and 470, wherein the output voltage (VBB+Vth) is obtained by summing up a threshold voltage Vtn and the reduced voltage VBB.

If the data line driving units 460 and 470 are provided with the input signal in of a high level and the inverted input signal inb of a low level, the data line lio has an output voltage level of the first clamping unit 475 and the inverted data line liob is driven to the core voltage level VCORE. On the other hand, if the input signal in of a low level and the inverted input signal inb of a high level are coupled, the data line lio is driven to the core voltage level VCORE and the inverted data line liob is driven to an output voltage level of the first clamping unit 465.

When precharging and equalizing the data line pair, the input signals in and inb become a low level, so that all of transistors 461, 462, 471 and 472 of the data line driving units 460 and 470 are turned off.

After then, the equalizing control signal lio_eq having a low level is fed to enable the precharging/equalizing unit 480. Then, two data line precharging transistors 481 and 482 are turned on to precharge the data line pair lio and liob (or gio and giob) with the core voltage VCORE and an equalizing transistor 483 is also turned on to equalize the data line pair lio and liob (or gio and giob) to have the same level.

As described above in detail, in accordance with the third embodiment of the present invention, it is possible to prevent the latch up occurring between the PMOS transistor 461 and the NMOS transistor 462 of the data line driving unit 460 for precharging the inverted data line liob or giob and that being induced between the PMOS transistor 471 and the NMOS transistor 472 of the data line driving unit 470 for precharging the data line lio or gio. Furthermore, it is also possible to preclude the latch up occurring between the PMOS transistor 481 of the precharging/equalizing unit 480 for equalizing the data line pair and the NMOS transistor 462 of the data line driving unit 460, and that being induced between the PMOS transistor 482 of the precharging/equalizing unit 480 and the NMOS transistor 472 of the data line driving unit 470.

Figure 10B:
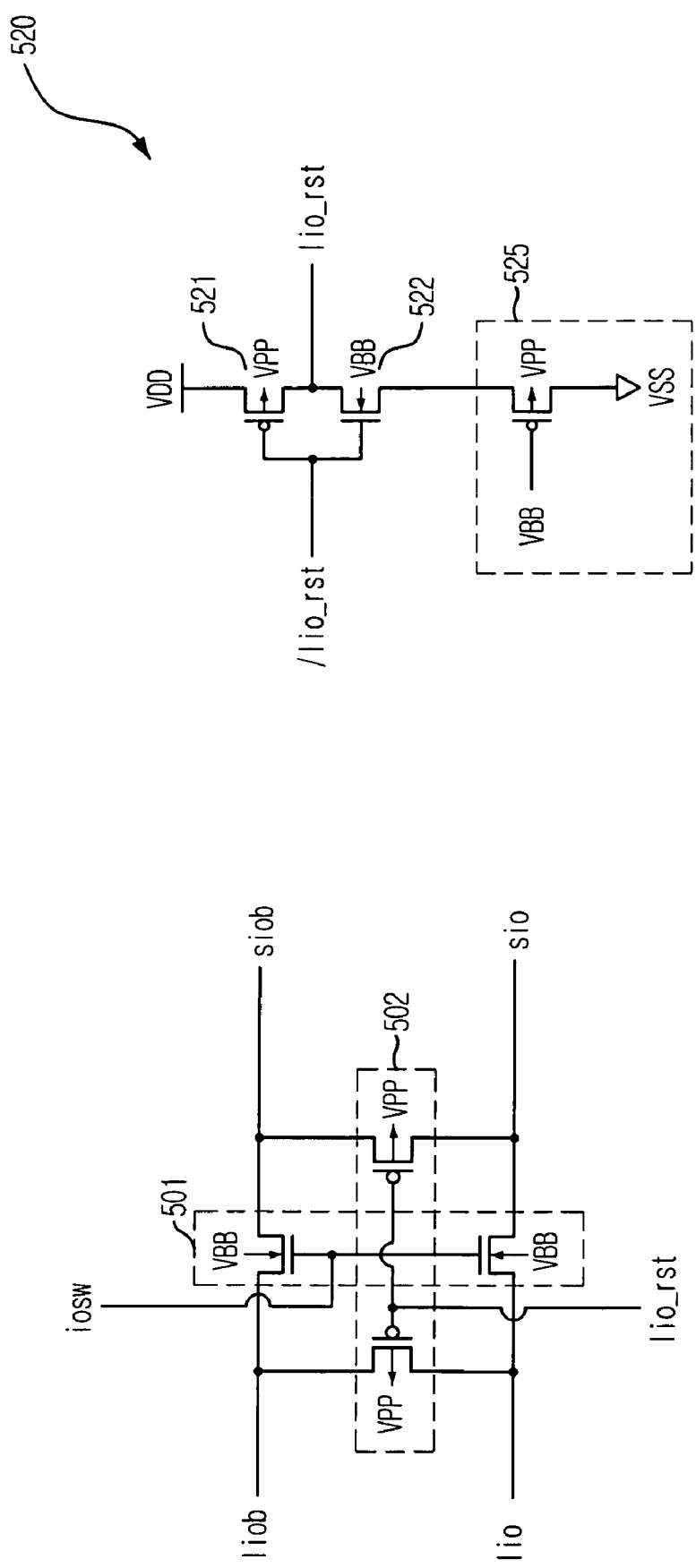

FIGS. 10A and 10B represent circuit diagrams of an equalizing unit for equalizing segment data input/output (I/O) lines and local data input/output (I/O) lines and a unit for producing a control signal to control enable/disable of the equalizing unit in accordance with a fourth embodiment of the present invention.

With reference to FIGS. 10A and 10B, there are depicted an isolation switching unit 501 for controlling the transmission between a pair of local data I/O lines lio and liob and a pair of segment data I/O lines sio and siob, and an equalizing unit 502 for equalizing the segment data I/O lines sio and siob and the local data I/O lines lio and liob. A data line reset signal lio_rst is used to control the enable or disable of the equalizing unit 502. The data line reset signal lio_rst is generated at a control signal generating unit 510 or 520 and provided to the equalizing unit 502. The control signal generating units 510 and 520 employ clamping units 515 and 525, respectively, for clamping their source voltage to a voltage level lower than a bulk bias of a MOS transistor.

Meanwhile, since the basic construction of the control signal generating units 510 and 520 and the clamping units 515 and 525 are the same as those in the first and the second embodiments, the repeated explanation will be omitted.

Referring to FIG. 10A, in the control signal generating unit 510, if a supply voltage VDD passes through the clamping unit 515, an output voltage of (VPP−Vth) is coupled to a source of a PMOS transistor 511, wherein the output voltage (VPP−Vth) is obtained by subtracting a threshold voltage Vtn from a boosted voltage VPP.

If an input node of the control signal generating unit 510 is provided with an input signal of a low level, the control signal generating unit 510 outputs an output voltage of the clamping unit 515 which becomes an enable signal of the equalizing unit 502 for equalizing the segment I/O lines sio and siob and the local data I/O lines lio and liob through its output node. On the other hand, if the input signal having a high level is provided thereto, the control signal generating unit 510 outputs a ground voltage VSS which becomes a disable signal of the equalizing unit 502 through its output node. Then, the equalizing unit 502 operates according to a voltage level at the output node of the control signal generating unit 510.

Referring to FIG. 10B, in the control signal generating unit 520, if the ground voltage VSS passes through the clamping unit 525, an output voltage of (VBB+Vtp) is fed to a source of an NMOS transistor 522, wherein the output voltage (VBB+Vtp) is obtained by summing up a threshold voltage Vth and a reduced voltage VBB.

If an input node of the control signal generating unit 520 is supplied with an input signal of a high level, the control signal generating unit 520 outputs the output voltage of the clamping unit 525 which becomes the disable signal of the equalizing unit 502 for equalizing the segment I/O lines sio and siob and the local data I/O lines lio and liob through its output node. On the other hand, if the input signal having a low level is provided thereto, the control signal generating unit 520 outputs the supply voltage VDD which becomes the enable signal of the equalizing unit 502 through its output node. Then, the equalizing unit 502 operates according to a voltage level at the output node of the control signal generating unit 520.

Accordingly, it is possible to prevent the latch up occurring between the PMOS and the NMOS transistors 511 and 512 of the control signal generating unit 510 and that being induced between the PMOS and the NMOS transistors 521 and 522 of the control signal generating unit 520.

As described above in detail, although the voltage level of the boosted voltage VPP is unstable and, thus, it is reduced lower than that of the supply voltage VDD or the core voltage VCORE, the output voltage of the clamping unit is always lower than the boosted voltage VPP. Meanwhile, even though the voltage level of the reduced voltage VBB is unstable and, thus, it is increased higher than that of the ground voltage VSS, the output voltage of the clamping unit is always higher than the reduced voltage VBB. As a result, it is possible to prevent the latch up phenomenon from occurring.

Moreover, since the boosted voltage VPP or the reduced voltage VBB is supplied to a gate node of the clamping unit and a bulk bias of the MOS transistor, there is an effect of reducing power consumption.

The present application contains subject matter related to Korean patent application No. 2004-29265, filed in the Korean Patent Office on Apr. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
means for precharging and equalizing a pair of bit lines; and
means for generating a control signal which controls enable and disable of the precharging/equalizing means,
wherein the control signal generating means includes
a CMOS transistor; and
a clamping means wherein the clamping means to clamp a source voltage transferred to the CMOS transistor uses a bulk bias voltage of the CMOS transistor in order to reduce a latch-up phenomenon caused by the CMOS transistor,
wherein the control signal generating means includes
a PMOS transistor; and
an NMOS transistor whose gates commonly form an input node and drains commonly form an output node of the control signal generating means, the PMOS transistor using a boosted voltage as a bulk bias and receiving an output voltage of the clamping means as its source voltage, and the NMOS transistor using a reduced voltage as its bulk bias and receiving a ground voltage as its source voltage.

2. The semiconductor memory device of claim 1, wherein the clamping means has an NMOS transistor whose gate is coupled with the boosted voltage and source is provided with a supply voltage, and which receives the reduced voltage as a bulk bias, and the output voltage of the clamping means is generated through a drain of said NMOS transistor.

3. A semiconductor memory device comprising:
means for precharging and equalizing a pair of bit lines; and
means for generating a control signal which controls enable and disable of the precharging/equalizing means,
wherein the control signal generating means includes
a CMOS transistor; and
a clamping means wherein the clamping means to clamp a source voltage transferred to the CMOS transistor uses a bulk bias voltage of the CMOS transistor in order to reduce a latch-up phenomenon caused by the CMOS transistor,
wherein the control signal generating means includes a PMOS transistor; and
an NMOS transistor whose gates commonly form an input node and drains commonly form an output node of the control signal generating means, the PMOS transistor using a boosted voltage as a bulk bias and receiving a supply voltage as its source voltage, and the NMOS transistor using a reduced voltage as its bulk bias and receiving an output voltage of the clamping means as its source voltage.

4. The semiconductor memory device of claim 3, wherein the clamping means has a PMOS transistor whose gate is coupled with the reduced voltage and source is provided with a ground voltage, and which receives the boosted voltage as a bulk bias, and the output voltage of the clamping means is produced through a drain of said PMOS transistor.

5. A semiconductor memory device comprising:
a sense amplifier, connected to a pair of bit lines, for amplifying electric potential difference of the bit line pair;
a sense amplifier driver which includes means for precharging and equalizing a driving voltage line of the sense amplifier and drives the sense amplifier driving voltage line; and
a control signal generating means which produces a control signal to control enable and disable of the precharging/equalizing means in the sense amplifier driver,
wherein the control signal generating means includes
a CMOS transistor; and
a clamping means wherein the clamping means to clamp a source voltage transferred to the CMOS transistor using a bulk bias voltage the CMOS transistor in order to reduce a latch-up phenomenon caused by the CMOS transistor,
wherein the control signal generating means includes
a PMOS transistor; and
an NMOS transistor whose gates commonly form an input node and drains commonly form an output node of the control signal generating means, the PMOS transistor using a boosted voltage as a bulk bias and receiving an output voltage of the clamping means as its source voltage, and the NMOS transistor using a reduced voltage as its bulk bias and receiving a ground voltage as its source voltage.

6. The semiconductor memory device of claim 5, wherein the clamping means has an NMOS transistor whose gate is coupled with the boosted voltage and source is provided with a supply voltage, and which receives the reduced voltage as a bulk bias, and the output voltage of the clamping means is generated through a drain of said NMOS transistor.

7. A semiconductor memory device comprising:
a sense amplifier, connected to a pair of bit lines, for amplifying electric potential difference of the bit line pair;
a sense amplifier driver which includes means for precharging and equalizing a driving voltage line of the sense amplifier and drives the sense amplifier driving voltage line; and
a control signal generating means which produces a control signal to control enable and disable of the precharging/equalizing means in the sense amplifier driver,
wherein the control signal generating means includes
a CMOS transistor; and
a clamping means wherein the clamping means to clamp a source voltage transferred to the CMOS transistor using a bulk bias voltage the CMOS transistor in order to reduce a latch-up phenomenon caused by the CMOS transistor,
wherein the control signal generating means includes
a PMOS transistor; and
an NMOS transistor whose gates commonly form an input node and drains commonly form an output node of the control signal generating means, the PMOS transistor using a boosted voltage as a bulk bias and receiving a supply voltage as its source voltage, and the NMOS transistor using a reduced voltage as its bulk bias and receiving an output voltage of the clamping means as its source voltage.

8. The semiconductor memory device of claim 7, wherein the clamping means has a PMOS transistor whose gate is coupled with the reduced voltage and source is provided with a ground voltage, and which receives the boosted voltage as a bulk bias, and the output voltage of the clamping means is produced through a drain of said PMOS transistor.

9. A semiconductor memory device comprising:
a pair of data lines;
means including a first CMOS transistor for driving an input signal to the data line pair;
means including a second CMOS transistor for precharging and equalizing the data line pair;
a first clamping means for clamping a source voltage transferred to the first CMOS transistor of the data line driving means using a bulk bias of the first CMOS transistor in order to reduce a latch-up phenomenon caused by the frist CMOS transistor; and
a second clamping means for clamping a source voltage transferred to the second CMOS transistor of the precharging/equalizing means using the second CMOS transistor in order to reduce a latch-up phenomenon caused by the second CMOS transistor,
wherein the driving means includes
a PMOS transistor; and
an NMOS transistor which are connected to the data line pair and whose gates receives a control signal and drains commonly form an output node connected to the data line, the PMOS transistor using a boosted voltage as a bulk bias and receiving an output voltage of the first clamping means as its source voltage, and the NMOS transistor using a reduced voltage as its bulk bias and receiving a ground voltage as its source voltage.

10. The semiconductor memory device of claim 9, wherein the first clamping means has an NMOS transistor whose gate is coupled with the boosted voltage and source is provided with a core voltage, and which receives the reduced voltage as a bulk bias, and the output voltage of the first clamping means is generated through a drain of said NMOS transistor.

11. The semiconductor memory device of claim 9, wherein the precharging/equalizing means PMOS transistors which are connected to the data line pair and whose gates receives a control signal and drains form an output node connected to the data line pair, one PMOS transistor of said PMOS transistors using a boosted voltage as a bulk bias and receiving an output voltage of the second clamping means as its source voltage, and the other PMOS transistor of said PMOS transistors receiving the control signal through its gate and whose source and drain are connected to the data line pair, respectively.

12. The semiconductor memory device of claim 11, wherein the second clamping means has an NMOS transistor whose gate is coupled with the boosted voltage and source is provided with a core voltage, and which receives the reduced voltage as a bulk bias, and the output voltage of the second clamping means is generated through a drain of said NMOS transistor.

13. A semiconductor memory device comprising:
a pair of data lines;
means including a first CMOS transistor for driving an input signal to the data line pair;
means including a second CMOS transistor for precharging and equalizing the data line pair;
a first clamping means for clamping a source voltage transferred to the first CMOS transistor of the data line driving means using a bulk bias of the first CMOS transistor in order to reduce a latch-up phenomenon caused by the frist CMOS transistor; and
a second clamping means for clamping a source voltage transferred to the second CMOS transistor of the precharging/equalizing means using the second CMOS transistor in order to reduce a latch-up phenomenon caused by the second CMOS transistor,
wherein the driving means includes
a PMOS transistor; and
an NMOS transistor which are connected to the data line pair and whose gates receives a control signal and drains commonly form an output node connected to the data line, the PMOS transistor using a boosted voltage as a bulk bias and receiving a supply voltage as its source voltage, and the NMOS transistor using a reduced voltage as its bulk bias and receiving an output voltage of the first clamping means as its source voltage.

14. The semiconductor memory device of claim 13, wherein the first clamping means has a PMOS transistor whose gate is coupled with the reduced voltage and source is provided with a ground voltage, and which receives the boosted voltage as a bulk bias, and the output voltage of the first clamping means is generated through a drain of said PMOS transistor.

15. A semiconductor memory device comprising:
a pair of local data input/output (I/O) lines and a pair of segment data input/output (I/O) lines;
an isolation switching means for controlling transmission between the segment data I/O line pair and the local data I/O line pair;
means for equalizing the segment data I/O line pair and the local data I/O line pair; and
means for generating a control signal used to control enable and disable of the equalizing means,
wherein the control signal generating means includes a CMOS transistor and a clamping means wherein the clamping means to clamp a source voltage transferred to the CMOS transistor uses a bulk bias voltage of the CMOS transistor in order to reduce a latch-up phenomenon caused by the CMOS transistor.

16. The semiconductor memory device of claim 15, wherein the control signal generating means includes a PMOS transistor and an NMOS transistor whose gates commonly form an input node and drains commonly form an output node of the control signal generating means, the PMOS transistor using a boosted voltage as a bulk bias and receiving an output voltage of the clamping means as its source voltage, and the NMOS transistor using a reduced voltage as its bulk bias and receiving a ground voltage as its source voltage.

17. The semiconductor memory device of claim 16, wherein the clamping means has an NMOS transistor whose gate is coupled with the boosted voltage and source is provided with a supply voltage, and which receives the reduced voltage as a bulk bias, and the output voltage of the clamping means is generated through a drain of said NMOS transistor.

18. The semiconductor memory device of claim 15, wherein the control signal generating means includes a PMOS transistor and an NMOS transistor whose gates commonly form an input node and drains commonly form an output node of the control signal generating means, the PMOS transistor using a boosted voltage as a bulk bias and receiving a supply voltage as its source voltage, and the NMOS transistor using a reduced voltage as its bulk bias and receiving an output voltage of the clamping means as its source voltage.

19. The semiconductor memory device of claim 18, wherein the clamping means has a PMOS transistor whose gate is coupled with the reduced voltage and source is provided with a ground voltage, and which receives the boosted voltage as a bulk bias, and the output voltage of the clamping means is produced through a drain of said PMOS transistor.

* * * * *